(12) United States Patent
Daniels

(10) Patent No.: US 7,218,111 B2
(45) Date of Patent: May 15, 2007

(54) INSTRUMENT TO MEASURE THE POLARIZATION OF A HYPERPOLARIZED SUBSTANCE

(76) Inventor: James Maurice Daniels, 40 Cranbury Rd., Princeton Junction, NJ (US) 08550

( * ) Notice: Subject to any disclaimer, the term of this patent is extended or adjusted under 35 U.S.C. 154(b) by 52 days.

(21) Appl. No.: 11/287,108

(22) Filed: Nov. 26, 2005

(65) Prior Publication Data

US 2006/0119834 A1    Jun. 8, 2006

Related U.S. Application Data

(60) Provisional application No. 60/634,040, filed on Dec. 7, 2004.

(51) Int. Cl.
*G01V 3/00*    (2006.01)
(52) U.S. Cl. ...................... 324/313; 324/317
(58) Field of Classification Search ............... 342/313, 342/317, 318, 319, 322, 309, 307, 300; 600/410, 600/420
See application file for complete search history.

(56) References Cited

U.S. PATENT DOCUMENTS 6,356,080 B1 *  3/2002  Daniels ...................... 324/313
6,867,591 B2 *  3/2005  Nelson ....................... 324/317

* cited by examiner

*Primary Examiner*—Brij B. Shrivastav

(57) ABSTRACT

This invention concerns a new embodiment of the instrument to measure nuclear polarization described in U.S. Pat. No. 6,356,080.

Figure 1:
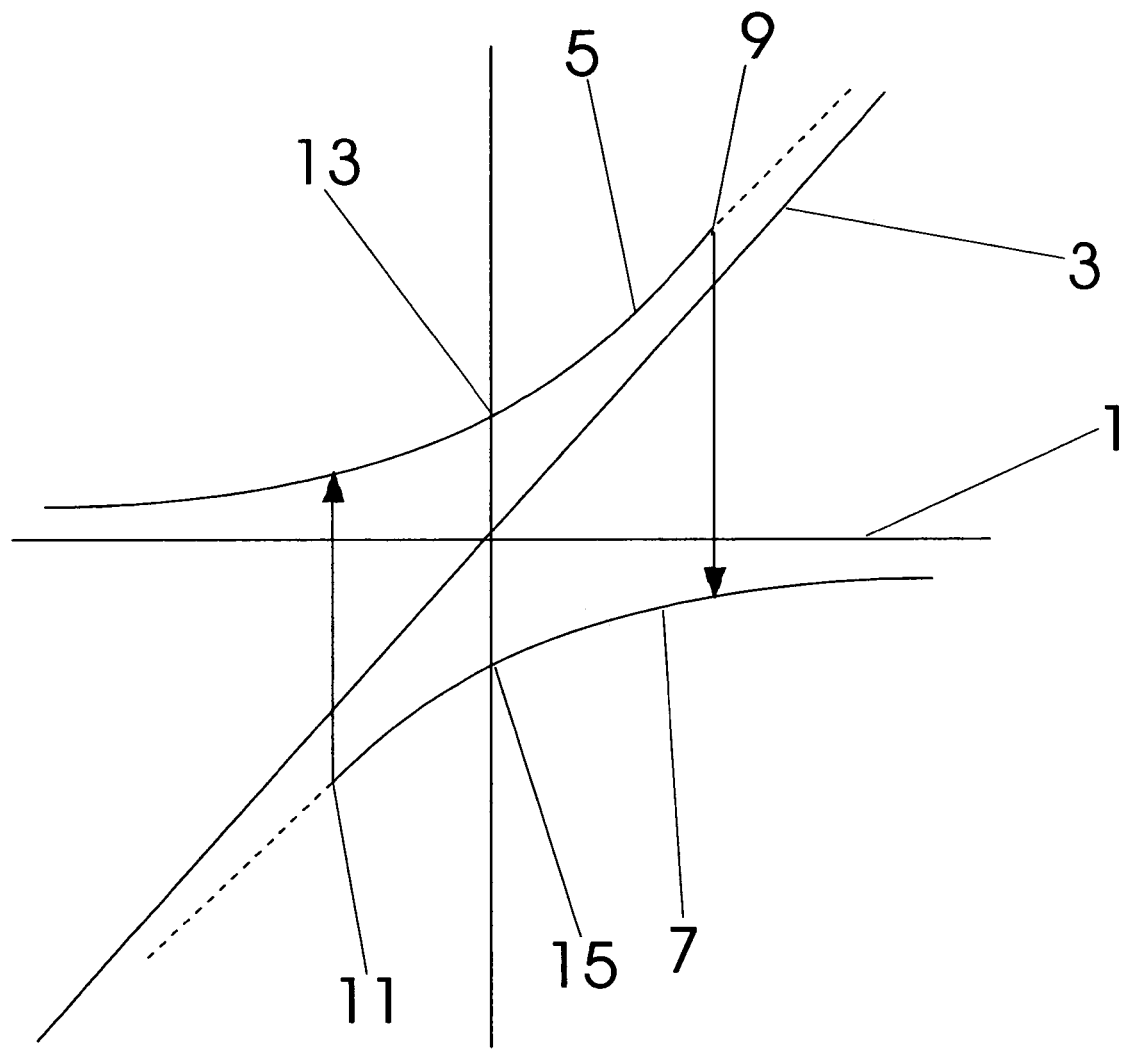

The coil, that couples the nuclear polarized substance to the electronics, has been designed not to pick up ambient electromagnetic noise. The output from the low level oscillator is passed through a Schmidt trigger to reduce noise. A local oscillator beats with the output of the low level oscillator to provide an audible output.

The instrument is automated, using a microprocessor with a customized downloaded program, to control the operation of the instrument and to output the results of measurement to a liquid crystal display and, if desired, to an external computer. This computer is not necessary and the instrument can act as a stand alone.

3 Claims, 1 Drawing Sheet

INSTRUMENT TO MEASURE THE POLARIZATION OF A HYPERPOLARIZED SUBSTANCE

CROSS REFERENCE

This application is entitled to the benefit of provisional patent application 60/634,040 filed Dec. 7, 2004.
Reference cited: U.S. Pat. No. 6,356,080.

STATEMENT REGARDING FEDERALLY SUPPORTED RESEARCH AND DEVELOPMENT

Not applicable.

BACKGROUND

1. Field of the Invention

This invention relates to the measurement of the polarization of a "hyperpolarized resonant" substance: that is, a substance whose nuclear or electronic spins are not in thermal equilibrium (i.e. hyperpolarized) and which exhibit magnetic resonance.

2. Prior Art

Hyperpolarized noble gases have been shown to be very effective for magnetic resonance imaging of the lungs, and their use in clinical diagnosis is poised as a new procedure. For this reason, an instrument to measure the polarization of the gas is needed for the production, distribution and use of these gases. There are two methods for this in use today.

In one method, (the "small angle tip" method) the polarization vector is tipped away from the defined direction of polarization (i.e. the ambient magnetic field) by a small angle $\theta$, say 5°. The polarization then precesses about the field, and the transverse component of magnetization induces a voltage in a suitably placed coil. This magnitude of this voltage (known as the "free induction decay") is proportional to the polarization. After the decay of the transverse polarization, the remaining polarization is reduced by a factor $(1-\cos\theta)$. Thus, some polarization is lost with each measurement. This method requires what is essentially a (suitably modified) magnetic resonance, or magnetic resonance imaging instrument.

In another method, a coil is wound round the tube which conveys hyperpolarized gas to a patient. When the composition of the gas passing along this tube changes from air to hyperpolarized gas, a voltage is induced in this coil. This voltage is integrated, and the result is proportional to the polarization. The disadvantage of this method is that it can be used only once, at the instant of administration to a patient.

SUMMARY

This invention is a small self contained portable instrument for measuring the polarization of a sample of a hyperpolarized substance. It can be used independently of any other installation, and it causes minimal (essentially no) disturbance of the polarization of the sample. Thus, continuous monitoring of the polarization is possible, even in transit.

This is a development of the instrument described in U.S. Pat. No. 6,356,080. This instrument retains the system of feedback via a high gain amplifier followed by a limiter to produce sustained oscillations at a very low level, the "Robinson circuit." The developments are in the circuitry, and in alternative methods of making frequency measurements, already mentioned in U.S. Pat. No. 6,356,080.

A specimen of the hyperpolarized substance is contained in the coil of an L-C resonant electric circuit, and is in an ambient magnetic field producing magnetic resonance of the polarized nuclei. This coupled system resonates in either of two modes, and the frequencies of resonance of these two modes are different from each other, and different from the resonant frequencies of each of the two components (the L-C circuit and the precessing nuclei). The polarization is deduced from measurements of the frequencies of these two modes, in various magnetic fields.

The magnetic fields where the frequency is measured are accessed by a microprocessor, using a stored program, which sends signals to a circuit which controls the magnetic field. The microprocessor reads the frequency from a counter, calculates the result, and displays it on a liquid crystal display screen. Output to a recorder is possible.

LIST OF DRAWINGS

FIG. 1. A graph showing how the frequencies of oscillation (ordinate) of the coupled system—electrical resonant circuit and hyperpolarized substance—vary with applied magnetic field (abscissa).

DESCRIPTION OF THE INSTRUMENT

The instrument consists of two parts, connected by a coaxial cable.

The first part is the "measuring head," described in U.S. Pat. No. 6,356,080. In this new embodiment, the electrical resonant circuit is not restricted to the simple L-C circuit described in that patent, other resonant circuits may be used.

The second part is the box, of size about 300 cubic inches in this embodiment, containing the electronic controls, batteries, display and a port to connect the box to a recorder, or to a computer to configure the instrument, or to upload results of measurements, as may be desired.

Principle of Operation

FIG. 1 is a graph of the frequency at which an resonant electric circuit, coupled to a sample of polarized nuclei, will oscillate when excited by an amplifier and limiter system as originally devised by F. N. H. Robinson and described in U.S. Pat. No. 6,356,080. The ordinate represents frequency; the abscissa represents the magnetic field which determines the resonant frequency of the nuclei. The horizontal line (1) is a graph of the resonant frequency of the L-C circuit. The sloping line (3) is a graph of the resonant frequency of the nuclei. The system performs oscillations in unison in two different modes, and the frequencies of oscillation are depicted in FIG. 1 by the curves (5) and (7). For each mode there is a point (9) and (11) beyond which oscillations cannot be sustained. The graphs of frequencies (5) and (7) depend on the polarization. The polarization can therefore be deduced from measurements of the frequencies of the two modes at various magnetic fields, and there are several possibilities. These include, but are not limited to, the following:

One possibility is to measure the difference in frequency of the two modes at a point of instability (9) or (11) by noting the jump in frequency which occurs when a point of instability is reached in a sweep of the magnetic field. Another is to measure the frequency of one mode at a point of instability.

Another is to measure the difference in frequency of the two modes at the points (13) and (15) where the L-C circuit and the polarized nuclei have the same resonant frequency. Because the magnetic field which probes the nuclei is so weak, and also at a different frequency from the nuclear resonant frequency, the nuclei are disturbed to a negligible extent. The most desirable situation is where measurements are made where the difference between the oscillation frequency and the nuclear resonant frequency is largest, and this is at the points (13) and (15). In addition, when the instrument is resting between measurements, the resonant frequency of the nuclei should be as far as possible from the oscillation frequency.

New Embodiment

In this embodiment, the operation is controlled by a microprocessor. The points on the graph FIG. 1 where the frequency is measured, and the path which the magnetic field traces to access these points, are chosen by a program downloaded from a personal computer and installed in non-volatile memory in the microprocessor. This program is designed for efficiency of operation. For example, to save time in a normal sweep, the microprocessor remembers the value of the field at this instability the last time it was detected, and, as it approaches this value, it takes smaller and smaller steps. After each step, the microprocessor determines the next value of the field and sends a signal, via a digital to analog converter, to the circuit which controls the current in the coils which produce the magnetic field.

The operation of the various segments of the program are initiated by signals from a timing circuit. This comprises a crystal controlled oscillator whose output is counted down to provide:

1. A gate, permitting the output of the Robinson oscillator to be routed to a ripple counter for a selectable period.

2. A signal to the microprocessor to read the ripple counter and to reset it.

The microprocessor then makes the necessary decisions and calculations, sends the required signals to the magnetic field control circuit, and sends the results of the calculations to a liquid crystal display screen and to the output port, as may be decided by the installed program.

In one embodiment of this instrument, the output from the Robinson oscillator is passed through a Schmidt trigger to reduce the effects of circuit noise, and to present a clean output to the frequency counters.

In one embodiment of this instrument, the inductor of the resonant circuit of the Robinson oscillator was made of two concentric solenoids, connected in opposition to eliminate pickup from ambient magnetic fields and other electrical noise.

In this embodiment, there is also a variable frequency local oscillator, whose output is mixed with the output of the Robinson oscillator to produce an audible beat. This serves as a rough aural indication of the operation of the instrument, and is useful as a warning.

I claim:

1. An instrument to measure the polarization of a hyperpolarized substance, using resonant frequency of said hyperpolarized substance comprising:
    a) an electrical L-C resonant circuit, the inductance of which contains the specimen of said hyperpolarized substance, whose polarization is to be measured, to be situated in an ambient magnetic field;
    b) a feedback circuit based on a high gain amplifier and a limiter (a Robinson oscillator) in order to maintain said L-C circuit in oscillation at a low amplitude;
    c) a timer circuit as a frequency counter configured to measure the frequency of oscillation of said L-C circuit by counting the number of oscillations in a fixed time interval;
    d) a microprocessor configured to control the operation of said instrument, including a selection of values from a plurality of values of said ambient magnetic field, wherein the modes of oscillations in which the frequency of said L-C circuit is measured are determined by reading the frequency from said frequency counter and to perform calculations in order to send signals to a circuit which controls said ambient magnetic field component, transverse to the axis of the inductance of the L-C circuit;
    e) an electronic circuit to control the current in the coil which produces said ambient magnetic field, under the control command of a voltage sent by said microprocessor;
    f) a liquid crystal display module to display the results of calculations performed by said microprocessor;
    g) a local oscillator to beat with the said Robinson oscillator to produce an audible representation of the frequency of said Robinson oscillator; and
    h) a port to communicate with an external computer.

2. As claimed in claim 1, an oscillator interchangeable with said Robinson oscillator whose frequency is controlled by a signal from said microprocessor for using in an environment where said ambient magnetic field is not variable.

3. As claimed in claim 1, said microprocessor, having a software program which is configured to program the actions of said microprocessor to decide and to set in a convenient, efficient and intelligent manner the value of said ambient magnetic field component at which frequency measurements are to be performed, to search for the points of instability, and to express the results of calculations.

* * * * *